United States Patent
Brun et al.

(10) Patent No.: US 8,258,044 B2
(45) Date of Patent: Sep. 4, 2012

(54) METHOD FOR FABRICATING CHIP ELEMENTS PROVIDED WITH WIRE INSERTION GROOVES

(75) Inventors: Jean Brun, Champagnier (FR); Dominique Vicard, Saint-Nazaire-les-Eymes (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/103,533

(22) Filed: May 9, 2011

(65) Prior Publication Data

US 2011/0287606 A1 Nov. 24, 2011

(30) Foreign Application Priority Data

May 18, 2010 (FR) .................................. 10 02080

(51) Int. Cl.
 *H01L 21/00* (2006.01)
(52) U.S. Cl. .................. 438/460; 257/E21.599
(58) Field of Classification Search .......... 438/460; 257/E21.599
 See application file for complete search history.

(56) References Cited

U.S. PATENT DOCUMENTS

| | | | |
|---|---|---|---|
| 4,990,971 A | | 2/1991 | Le Creff |
| 5,501,784 A | * | 3/1996 | Lessmollmann et al. ....... 205/67 |
| 7,160,429 B2 | * | 1/2007 | Cohen et al. .................. 205/220 |
| 7,229,542 B2 | * | 6/2007 | Bang ................................ 205/67 |
| 7,252,861 B2 | * | 8/2007 | Smalley ......................... 427/264 |
| 2003/0162324 A1 | | 8/2003 | Tomimatsu |
| 2005/0223552 A1 | | 10/2005 | Meyer et al. |
| 2007/0178666 A1 | | 8/2007 | Do et al. |
| 2009/0227069 A1 | | 9/2009 | Brun et al. |
| 2011/0001237 A1 | | 1/2011 | Brun et al. |

FOREIGN PATENT DOCUMENTS

| | | |
|---|---|---|
| EP | 0 360 660 A1 | 3/1990 |
| EP | 2 099 060 A1 | 9/2009 |
| FR | 2 937 464 A1 | 4/2010 |
| WO | WO 2009/112644 A1 | 9/2009 |

* cited by examiner

*Primary Examiner* — Lex Malsawma
(74) *Attorney, Agent, or Firm* — Oliff & Berridge, PLC

(57) ABSTRACT

The invention relates to a method for fabricating chip elements provided with a groove from devices formed on a wafer. The method comprises the steps consisting in, depositing a sacrificial film on the wafer so as to leave a central part of each device exposed and to cover an edge of the device at the level of which the groove is to be formed; applying a mold on the sacrificial film; injecting a hardenable material into the mold; hardening the hardenable material; dicing the wafer between the devices; and eliminating the sacrificial film.

5 Claims, 2 Drawing Sheets

METHOD FOR FABRICATING CHIP ELEMENTS PROVIDED WITH WIRE INSERTION GROOVES

BACKGROUND OF THE INVENTION

The invention relates to microelectronic chip elements, the largest dimension of which can be smaller than a millimeter, that are secured to conducting wires serving the purpose for example of supplying power to the chips.

STATE OF THE ART

FIG. 1 represents a perspective view of a chip element 10 secured to two parallel wires 12a and 12b, as described in Patent application WO2009112644. Element 10 is of general parallelepipedic shape and two of its opposite side surfaces are provided with respective parallel grooves 14a and 14b which extend over the whole length of element 10. Each of these grooves respectively receives one of wires 12a and 12b.

Wires 12a and 12b generally have a role of electric connection, for example to supply electric current to a light-emitting diode formed in the chip of element 10. Wires 12a and 12b are thus conducting and are in electric connection with the chip by means of a conducting bump 16 formed on the side wall of each groove. The width of the grooves and the height of bumps 16 are selected according to the diameter of wires 12 so that each wire is pinched between the bump and the opposite side wall of groove 14.

An element of the type of FIG. 1 is generally made up of two parts. A first part 18a, corresponding to the bottom third of the element, is formed by the chip. A second part 18b, corresponding to the remaining top part of the element, forms a protective cover. The active surface of the chip, facing cover 18b, comprises bumps 16 and forms a first side wall of grooves 14. Cover 18b has a T-shaped cross-section so that it is able to form the second side wall and the bottom of the grooves.

On account of the smallness of chip elements 10, assembling covers 18b on chips 18a gives rise to a certain number of problems. It is in particular difficult to respect the distance separating the side walls of grooves 14 in reproducible manner. As described in the above-mentioned Patent application WO2009112644, it may be desirable for wires 12 to be secured by elastic pinching in the grooves between bumps 16 on one side and the opposite, side walls of the grooves on the other side. If the separating distance is too great, wires 12 are not able to be pinched. If the separating distance is too small, wires 12 are not able to be inserted in the grooves without breaking element 10.

SUMMARY OF THE INVENTION

It is therefore sought to provide means for achieving a reproducible and precise distance between the side walls of the grooves.

To tend to meet this requirement, a fabrication method is therefore provided to fabricate chip elements (10) provided with a groove (14) from devices (22) formed on a wafer (20). The method comprises the steps consisting in depositing a sacrificial film (26) on wafer (20) so as to leave a central part of each device (22) exposed and to cover an edge of the device at the level of which the groove is to be formed; applying a mold (28) on the sacrificial film; injecting a hardenable material (30) into the mold; hardening the hardenable material; dicing the wafer between the devices; and eliminating the sacrificial film.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
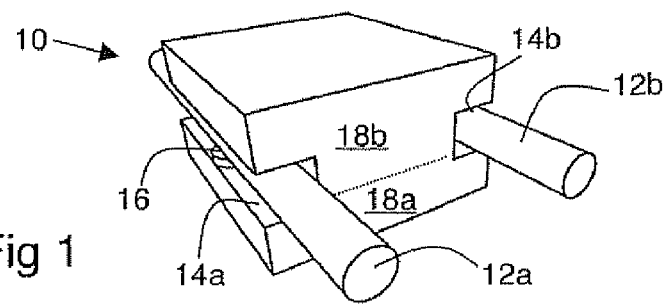
FIG. 1, described in the foregoing, represents a perspective view of a chip element secured to two wires.
Figure 2A:
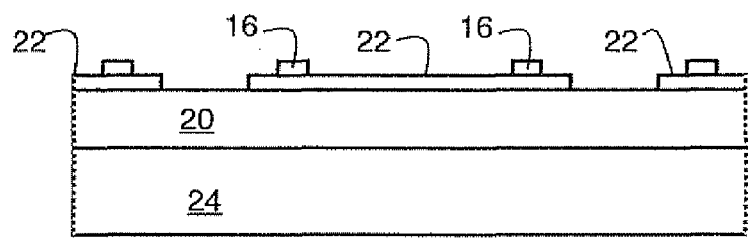
FIGS. 2A to 2F represent various steps of a method whereby chip elements with grooves of precise and reproducible width can be fabricated.

FIG. 2A represents a partial cross-sectional view of a wafer 20 on which a set of integrated devices 22 has been formed corresponding to chips 18a of the chip elements to be achieved. Each of these devices 22 is provided, on two of the edges thereof, with conducting bumps 16 subsequently serving the purpose of establishing contact with wires 12.

Wafer 20, for example made from silicon, has in this example been thinned so that the thickness of the latter is compatible with the required dimensions of the final chip elements. Preferably, as wafer 20 has been thinned and presents a reduced rigidity, the latter has been secured via its rear surface to a support plate, or "handle" 24, giving the assembly the required rigidity for the various steps of the fabrication method. Assembly of the wafer 20 on support plate 24 must as a general rule withstand the high temperatures encountered during the various fabrication operations of devices 22.

Figure 2B:
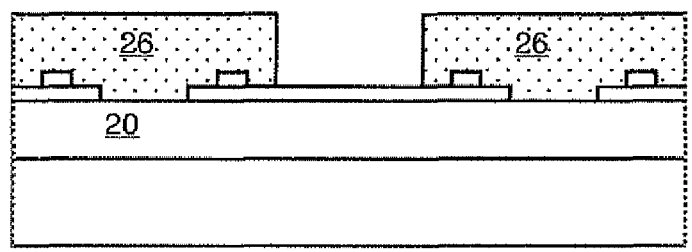

In FIG. 2B a sacrificial film 26 is deposited in a thick layer, for example 100 µm, on the top surface of wafer 20. This film 26 is made from a material able to be patterned, planarized, and eliminated by usual techniques in the semiconductors field. The material is for example a resin, a polyimide, or a metal.

As will be seen in the following, the thickness of this film 26 defines the width of future grooves 14. The usual deposition techniques enable an amply sufficient precision of the thickness of the film to be obtained. The distance that is required to be precise is in fact that separating the top of each bump 16 from the opposite wall of the groove. The techniques for fabricating bumps 16 also enable the required precision to be obtained.

As represented, film 26 is patterned, for example by photolithography, to leave the central parts of devices 22 exposed, while covering the edges provided with bumps 16 (the areas designed to formed the first side walls of the future grooves). Patterning is preferably anisotropic so that the openings in film 26 present walls perpendicular to the wafer, these walls defining the bottoms of the future grooves.

Figure 2C:
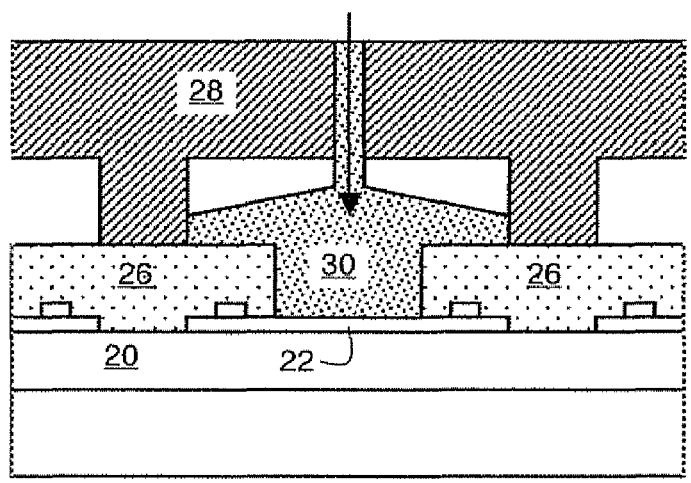

In FIG. 2C a mold 28 comprising cavities in correspondence with devices 22 is applied on film 26. The cavities of mold 28, together with the holes in film 26, define the shape of the future covers 18b of the chip elements, for example covers with a T-shaped cross-section.

A hardenable liquid 30 presenting the desired properties for the covers, for example a transparent epoxy resin in the case where devices 22 are light-emitting diodes, is injected into each cavity of mold 28.

Figure 2D:
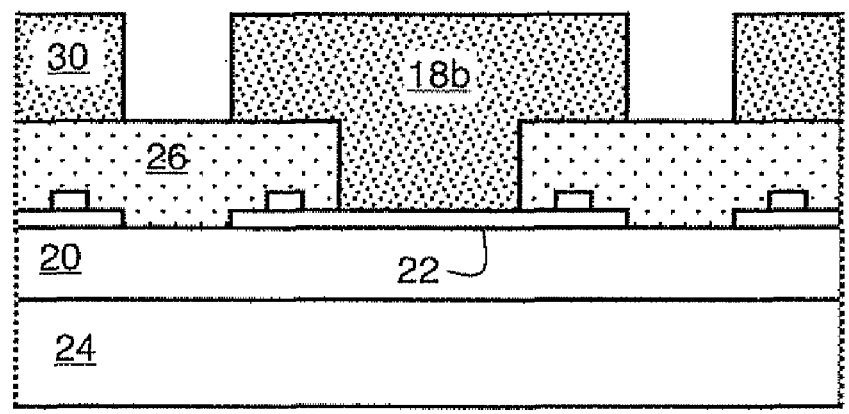

FIG. 2D represents the result obtained after resin 30 has hardened and mold 28 has been removed. Resin 30, overlying devices 22, forms covers 18b and leaves film 26 exposed in areas surrounding devices 22.

Figure 2E:
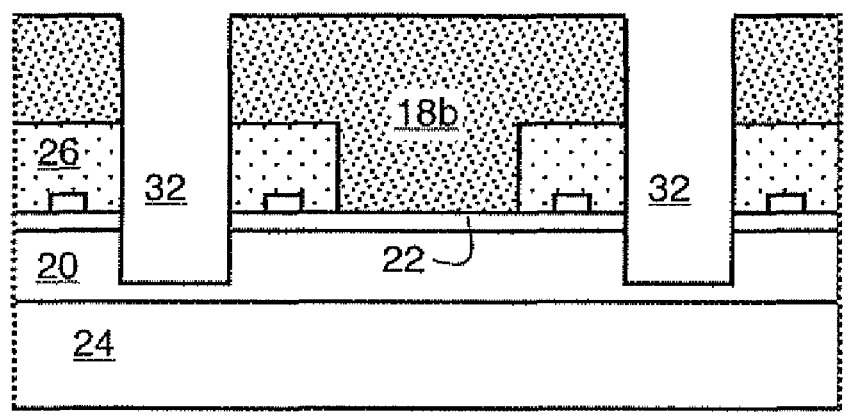

In FIG. 2E, dicing is performed via the top surface to separate devices 22 and form chips 18a. As represented, the dicing cuts 32 pass in the spaces left by the mold between covers 18b, pass through film 26, and start to cut wafer 20 without passing through the latter.

Figure 2F:
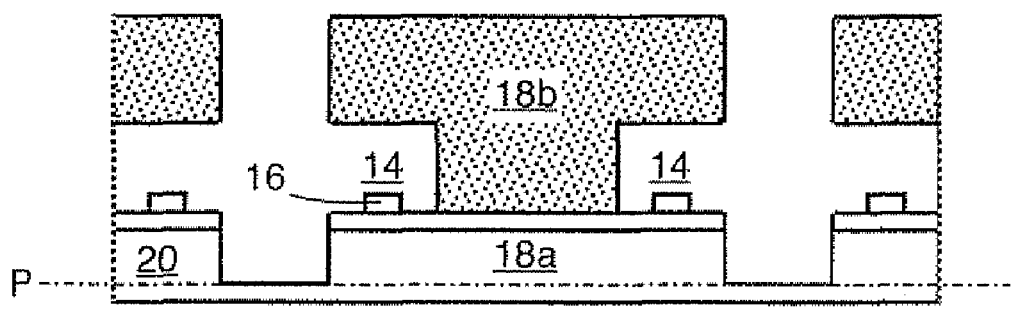

In FIG. 2F, the remainder of the sacrificial film 26 is eliminated, for example by plasma or chemical etching. Grooves 14 defined by covers 18b are thereby cleared above bumps 16 of chips 18a.

Elimination of sacrificial film 26 is preferably performed after dicing. By proceeding in this order, the dicing shavings are prevented from depositing in grooves 14 and from hindering establishment of the subsequent electric contact between wires 12 and bumps 16.

Removal of support plate 24 is then performed, followed by grinding of wafer 20 on the rear surface up to a plane P at the level of the bottoms of the dicing cuts to obtain individual chip elements 10.

To hold wafer 20 secure during removal of plate 24 and during grinding, covers 18b can for example by pressed on a removable adhesive support, not shown. After grinding, individual chip elements 10 remain stuck to the adhesive support and are then in a conditioning similar to that of conventional chips after wafer dicing. The chip elements can then be exploited by conventional chip-handling tools.

According to a variant, support plate 24 is removed before the dicing step of FIG. 2E and wafer 20 is secured via its rear surface to a removable adhesive support. Dicing cuts 32 then pass through wafer 20 and cut into the adhesive support.

To terminate fabrication of the chip elements, all that remains to be done is to eliminate the remaining pieces of sacrificial film 26 located at the level of grooves 14. This elimination is preferably performed by means of a low-temperature method compatible with the adhesive, for example by providing a sacrificial film 26 made from a metal which can be eliminated by chemical etching.

As in the previous case, we then have a set of individual chip elements 10 stuck onto a support, ready to be exploited by conventional handling tools. In this variant, instead of being stuck to a support by covers 18b, the elements are stuck by chips 18a.

One advantage of this variant is that it avoids the grinding step of the rear surface of wafer 20 and a risk of the shavings due to grinding depositing in grooves 14.

According to another alternative embodiment, the mold illustrated in FIG. 2C does not comprise an individualized cavity for each device 22, but a single cavity extending over the whole set of devices 22. In this case, after injection and hardening of resin 30, we are then at step of FIG. 2D with a layer of resin 30 uniformly covering sacrificial film 26. Individual covers 18b are then formed in the step of FIG. 2E by dicing cuts 32.

The invention claimed is:

1. A method for fabricating chip elements provided with a groove from devices formed on a wafer comprising the following steps:
   depositing a sacrificial film on the wafer so as to leave a central part of each device exposed and to cover an edge of the device at the level of which the groove is to be formed;
   applying a mold on the sacrificial film;
   injecting a hardenable material into the mold;
   hardening the hardenable material;
   dicing the wafer between the devices; and
   eliminating the sacrificial film.

2. The method according to claim 1, wherein the mold comprises a cavity associated with each chip.

3. The method according to claim 1, wherein the dicing step takes place before the sacrificial film elimination step.

4. The method according to claim 1, wherein the dicing cuts formed in the dicing step do not pass completely through the wafer, the method further comprising a step consisting in grinding the wafer on the rear surface thereof until the dicing cuts are reached.

5. The method according to claim 1, wherein the wafer is fixed via its rear surface to a support plate, the method comprising a step consisting in removing the wafer from the support plate after the dicing step.

\* \* \* \* \*